(12) United States Patent
Deas et al.

(10) Patent No.: US 7,271,659 B2
(45) Date of Patent: Sep. 18, 2007

(54) HIGH SPEED AMPLIFIER INCORPORATING PRE-EMPHASIS

(76) Inventors: Alexander Roger Deas, Kings's Gate Lodge, Dalkeith, Edinburgh (GB) EH22 1ST; Igor Anatolievich Abrosimov, 12-82 Prospect Hoshi-Mina, St. Petersburg (RU) 194356

( * ) Notice: Subject to any disclaimer, the term of this patent is extended or adjusted under 35 U.S.C. 154(b) by 0 days.

(21) Appl. No.: 10/997,591

(22) Filed: Nov. 24, 2004

(65) Prior Publication Data

US 2005/0088238 A1    Apr. 28, 2005

Related U.S. Application Data (63) Continuation-in-part of application No. PCT/RU2003/000254, filed on May 28, 2003.

(60) Provisional application No. 60/383,121, filed on May 28, 2002.

(51) Int. Cl.
*H03F 1/14* (2006.01)
(52) U.S. Cl. .......................................... 330/292; 330/9
(58) Field of Classification Search ................ 330/260, 330/292, 98–100
See application file for complete search history.

(56) References Cited

U.S. PATENT DOCUMENTS

| 4,559,502 | A  | 12/1985 | Hiujsing |
| 5,155,447 | A  | 10/1992 | Huijsing |
| 5,485,121 | A  | 1/1996  | Huijsing |
| 5,486,790 | A  | 1/1996  | Huijsing |
| 6,313,704 | B1 * | 10/2001 | Maruyama et al. ......... 330/259 |
| 6,573,790 | B2 * | 6/2003  | Steensgaard-Madsen .... 330/107 |
| 2002/0003441 | A1 | 1/2002 | Steensgaard-Madsen |

FOREIGN PATENT DOCUMENTS

WO    WO-00/03476 A1    1/2000

OTHER PUBLICATIONS

Lawrence, R. et al.: "The Kalman Filter for the Equalization of a Digital Communcations Channel," IEEE Transactions on Communication Technology, vol. com-19, No. 6, Dec. 1971, pp. 1137-1141.
You, f. et al.: "Multistage Amplifier Topologies with Nested Gm-C Compensation," IEEE Journal of Solid-State Circuits, vol. 32, No. 12, Dec. 1997, pp. 2000-2011.

* cited by examiner

*Primary Examiner*—Khanh Van Nguyen
(74) *Attorney, Agent, or Firm*—Darby & Darby (57) ABSTRACT

An amplifier circuit for receiving an input signal and providing an output signal, comprises a main chain of logic stages with a plurality of nodes therebetween, and at least one auxiliary chain nested between one node in the main chain and another node, which is not the next node, to form a series of feed back or feed forward nested equalisation loops; whereby the input signal is fed serially down the main chain and is also fed through the said at least one auxiliary chain and summed to provide the output signal. The invention overcomes gain-bandwidth limits of the drive stages and bandwidth reductions that occur when analogue stages operating in a linear mode are concatenated.

12 Claims, 7 Drawing Sheets

Fig. 9 si := 3        s0 := 500       $k := \frac{7.143}{6.143}$       $k1 := \frac{1}{3}$ $s1(a) := \frac{si}{k}$ s2(a) := s1(a) · k · a s3(a) := s2(a) · k · a − si · (k − 1)

s4(a) := s3(a) · k · a − s1(a) · (k − 1)

s5(a) := s4(a) · k · a − s2(a) · (k − 1)

s6(a) := s5(a) · k · a − s3(a) · (k − 1)

s7(a) := s6(a) · k · a − s4(a) · (k − 1)

s8(a) := s7(a) · k · a − s5(a) · (k − 1)

s9(a) := s8(a) · k · a − s6(a) · (k − 1)

s10(a) := s9(a) · k · a − s7(a) · (k − 1)

s11(a) := s10(a) · k · a − s8(a) · (k − 1) − s0 · k1 s12(a) := s11(a) − s9(a) · (k − 1)

y(a) := s12(a) − s10(a) · (k − 1)

a := 2.012        j := root (y(a), a)

Fig.10 j = 2.007

| | |
|---|---|
| s1(j) = 3.488 | s1(j) · (k − 1) = 0.568 |
| s2(j) = 8.14 | s2(j) · (k − 1) = 1.325 |
| s3(j) = 18.506 | s3(j) · (k − 1) = 3.013 |
| s4(j) = 42.616 | s4(j) · (k − 1) = 6.937 |
| s5(j) = 98.119 | s5(j) · (k − 1) = 15.972 |
| s6(j) = 225.946 | s6(j) · (k − 1) = 36.781 |
| s7(j) = 20.303 | s7(j) · (k − 1) = 3.305 |
| s8(j) = 31.405 | s8(j) · (k − 1) = 5.112 |
| s9(j) = 36.503 | s9(j) · (k − 1) = 5.942 |
| s10(j) = 81.873 | s10(j) · (k − 1) = 13.328 |
| s11(j) = 19.27 | si · (k − 1) = 0.488 |
| s12(j) = 13.328 | |

Fig.11

HIGH SPEED AMPLIFIER INCORPORATING PRE-EMPHASIS

CROSS REFERENCE TO RELATED APPLICATIONS

This application is a Continuation-in-Part of International Application Ser. No. PCT/RU2003/000254 filed on May 28, 2003, which claims the benefit of U.S. Provisional Application Ser. No. 60/383,121 filed May 28, 2002, which are incorporated by reference in their entirety.

TECHNICAL FIELD

The present invention relates to amplifiers in integrated circuits for the transmission of digital signals at high speed, such as the amplifier for an output driver or a receiver. More specifically, the present invention relates to operational amplifiers with increased gain in a wide bandwidth, in particular, to amplifiers incorporating a pre-emphasis circuit.

BACKGROUND OF THE INVENTION

Equalisation has been used since the 1940s for correcting the behaviour of inertial systems. Equalisation is now a standard engineering method that is used routinely wherever the response of a system is not ideal or adequate for the requirement. In this case, an engineer applies a filter with the inverse of the system response placed in series with the system can improve the performance of the combined system. This procedure is called equalisation. Examples of systems that use equalisation range from ultrasound transducers in sonar and to give the equivalent of a sharp pulse for fetal monitoring despite the ringing of the transducer, the accurate control of heavy radar dishes, the control of aircraft of deliberately unstable design such as with forward pointing or upswept wings. Equalisation is used in literally thousands of other applications.

Digital filters implementations of equalisation functions have been commonplace since the early 1960s. In the field of communications, R. E. Lawrence and H. Kaufman describes this process in 1971 in "The Kalman Filter for the Equalisation of a Digital Communications Channel", IEEE Trans. COM-19, No. 12, pp 1137 to 1141, replacing analogue methods that had been used considerably earlier. The need for equalisation in systems has the major market for digital signal processors (DSP), which is a large industry. These DSP systems are often very complex, performing equalisation which is adaptive and dynamic. However, all these systems only operate when the signal frequency is well below the operating frequency of the DSP.

Pre-emphasis is the simplest form of channel equalisation. It involves placing a fixed filter before, within or after the amplifier, that compensates for the general response of the channel.

It is traditional to classify the type of filter at an early stage. There are many ways to classify or consider a filter. Pre-emphasis may be finite in its impulse response, or infinite. The filter may be a continuous in time filter, or discrete in time, where samples are taken and then combined with various weightings. The filter may be implemented in analogue components, either as a linear or non-linear system, or implemented purely digitally, which can span from pipelined state machines to purely software on personal computer.

However, at the speeds considered by the present invention, the digital signal must be treated as an analogue signal, and the boundaries between the other classifications become blurred.

Prior art solutions to the pre-emphasis problem are limited in either speed or capability. At very high speeds, the prior art applies linear structures such as Rs, Ls and Cs, usually with active devices (amplifiers), to create a filter. These filters are insufficient for the adequate pre-emphasis, or are limited to the cut-off frequency of the amplifiers used in the structures. Digital filters are even more limited in frequency because they cannot work at more than half the speed of the sampling rate due to Nyquist sampling limits.

In the present invention the pre-emphasis is designed to overcome bandwidth limitations that may include limits of skin effects, dissipation factors of the line, package, ESD structures and electronic amplifiers, at a speeds close to the cut off frequency of the amplifiers that comprise the amplifier.

The function of the amplifier is to amplify the power of the signal from the level within the integrated circuit to a level sufficient to drive the output load, in this case a transmission line with termination. The amplifier always comprises a series of stages, with increasing size and drive ability. Each stage typically amplifies the signal by a factor of 2 to 6. Theoretical studies indicate the optimum for minimum propagation time through the amplifier is for each stage to amplifier a load around 3.5 times larger than the previous stage but this depends on the technology, optimisation approach and the frequencies involved. In the case of the present invention, propagation time is less significant than ensuring the maximum bandwidth for the combined amplifier structure.

The larger the gain of an amplifier stage, the lower the bandwidth of the stage. Moreover, when there is insufficient bandwidth of each stage, the distortion of the signal across the amplifier becomes bigger with more stages. This second effect can be considered in general as a reduction in bandwidth the more stages that are used. In 1948, R. Walker and H. Wallman in Vacuum Tube Amplifiers, Chapter 2, McGraw Hill Press, showed for the linear portion of the gate response that if the rise time of a signal is tr, then if there are n stages, then the rise time of the signal through those n stages is the square root of the sum of the squares of the rise time of each stage. The 10% to 90% rise time of a signal is between 0.35 and 0.44 of the period near the cut-off frequency of an amplifier, so using this metric the combination of six or more stages typical of an amplifier can be seen to be serious deleterious to the performance. Finally, phase amplification effects occur when the amplifier transmits a signal higher than the cut-off frequency, which causes extreme of both phase and amplitude distortion.

Figure 7:
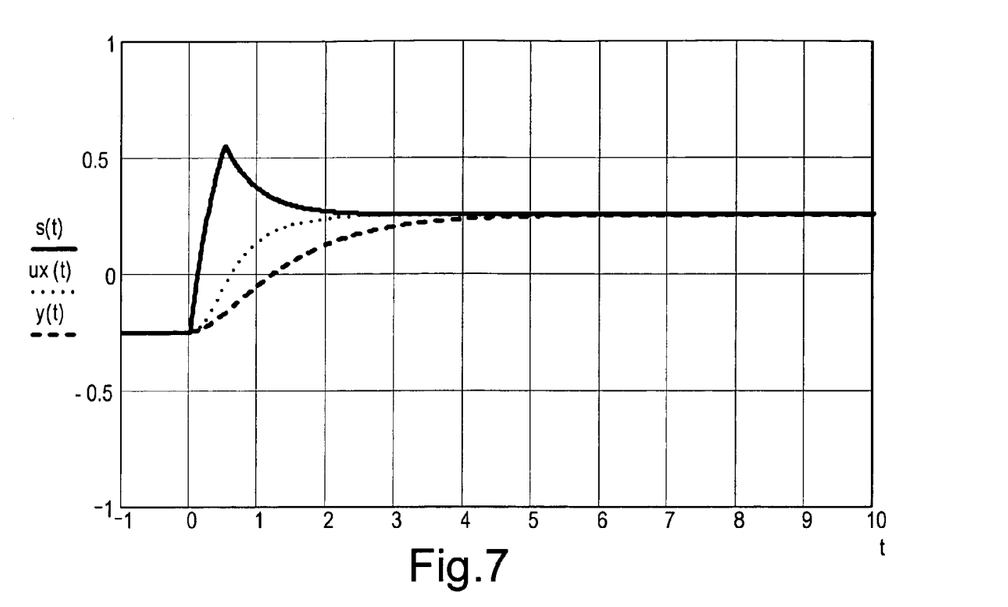
FIG. 7 shows the waveforms generated when a pulse according to FIG. 5 is applied to the amplifier according to the structures in FIG. 6.

U.S. Pat. No. 4,559,502 to Huijsing et al. describes a multi-stage operational amplifier with more than two stages, suitable for driving low-ohmic loads. A frequency response similar to that shown in FIG. 7 is obtained by using a so-called nested-miller compensation technique. In a nested-miller compensated operational amplifier, multiple compensation capacitors are connected from the output node to intermediate nodes in-between the individual stages, so that transconductance stages charge the state-variable capacitors by currents proportional to the input signal.

A variation of this technique which overcomes this problem is discussed in U.S. Pat. No. 5,155,447, also to Huijsing et al., and by Fan You et al. (Multistage Amplifier Topologies with Nested Gm—C Compensation, IEEE Journal of Solid-State Circuits, Vol. 32, No. 12, 1997). U.S. Pat. No.

5,485,121 to Huijsing and U.S. Pat. No. 5,854,573 to Chan are based on the same technique to avoid the change of polarity at high frequencies. U.S. Pat. No. 5,486,790 to Huijsing discusses a hybrid-nested-miller compensation technique, whereby the capacitive load of the output terminal is reduced, thus improving the slew-rate/power ratio.

Publication WO 00/03476 20 Jan. 2000 (U.S. Patent Application 2002/0003441, publ. 10 Jan. 2002) describes a linear wide-bandwidth negative-feedback system comprising a high-speed driver and a slower linear controller selectively suppressing the error signal in the system's signal band. However, the operational amplifier described in US 2002/0003441 uses pole splitting capacitors forming a load which cannot be easily adjusted, as impedance elements should not be changed dynamically because that will cause distortion. In other words, the capacitance should be adjusted only during a power-up calibration period, and then attain a constant value, or at most be altered at very rare occasions.

A disadvantage of this topology is that the transconductance stages load the input terminals capacitively. Furthermore, the transconductance stages must be able to handle a large common-mode signal swing. Still another problem called "right-plane-zero problem" is that the amplifier's polarity is changed when the compensation capacitors short-circuit the respective transconductance stages causing a lower unity-gain frequency.

Another limitation of the amplifier as described in WO 00/03476 is that only some of the buffer stages of the main chain have the widened bandwidth as provided by respective feedback auxiliary stages. For example, the $3^{rd}$ gm buffer stage has a negative feedback gm stage, and as a result, a widened bandwidth, while neither the $2^{nd}$, not the $4^{th}$ gm stages do not have negative feedbacks and thus, have limited bandwidth. This is predetermined by the amplifier topology, where the auxiliary stages are connected between the neighbouring nodes in the main chain of logic stages, as seen, e.g. in FIG. 20 of WO 00/03476. With this arrangement, in case the same feedback is provided for the $4^{th}$ gm stage, the system in whole will loose stability.

These problems are not addressed by any of the prior art: the conventional solution is simply to slow down the signal, or to fabricate an amplifier in ever increasingly exotic materials such as 3-Si, SiGe, Fully saturated SOI, etc. The present invention takes whatever process and material is used and than achieves the highest speed amplifier, or a close approximation thereto, with inherent pre-emphasis.

OBJECT OF THE INVENTION

It is therefore a primary object of the present invention to provide an amplifier with increased operating frequency or bandwidth.

It is another primary object of the present invention to provide a pre-emphasis function in the amplifier such that the pre-emphasis operates at speeds higher than the cut-off frequency that would normally apply to such amplifiers and pre-emphasis circuits.

It is another object of the invention to provide an improved, economical apparatus for transmitting and receiving data at high bit rates required for chip-to chip and high speed digital communications.

It is another object of the invention to provide an amplifier that amplifies the power of the signal to a predetermined level.

A particular form of the invention is suitable for transmitting digital data at 3GIO, Infiniband, Gigabit Ethernet, Acuid Ports and other high speed communications standards.

SUMMARY OF THE INVENTION

According to the present invention, an amplifier circuit comprises a main chain of amplification or buffer stages and at least one auxiliary chain nested between one node in the main chain and another node, which is not the next node, to form a series of feedback equalisation loops nested in the stages of the amplifier to overcome gain-bandwidth limits of the drive stages and to overcome bandwidth reductions that occur when analogue stages operating in a linear mode are concatenated.

The inventive concept of the present invention is to integrate a continuous in time filter with the amplifier. In the preferred embodiment, the amplifier forms an infinite impulse response filter for small signals and finite impulse response for large signals due to non-linearity of active elements implemented using digital components which operate in both linear and non-linear modes. Other classifications could be applied to the same circuit due to the aforementioned blurring between analogue and digital domains at very high speeds.

BRIEF DESCRIPTION OF THE DRAWINGS

For a better understanding of the present invention and the advantages thereof and to show how the same may be carried into effect, reference will now be made, by way of example, without loss of generality to the accompanying drawings in which.

DETAILED DESCRIPTION OF THE INVENTION

The invention will now be described in detail without limitation to the generality of the present invention with the aid of example embodiments and accompanying drawings.

Figure 9:
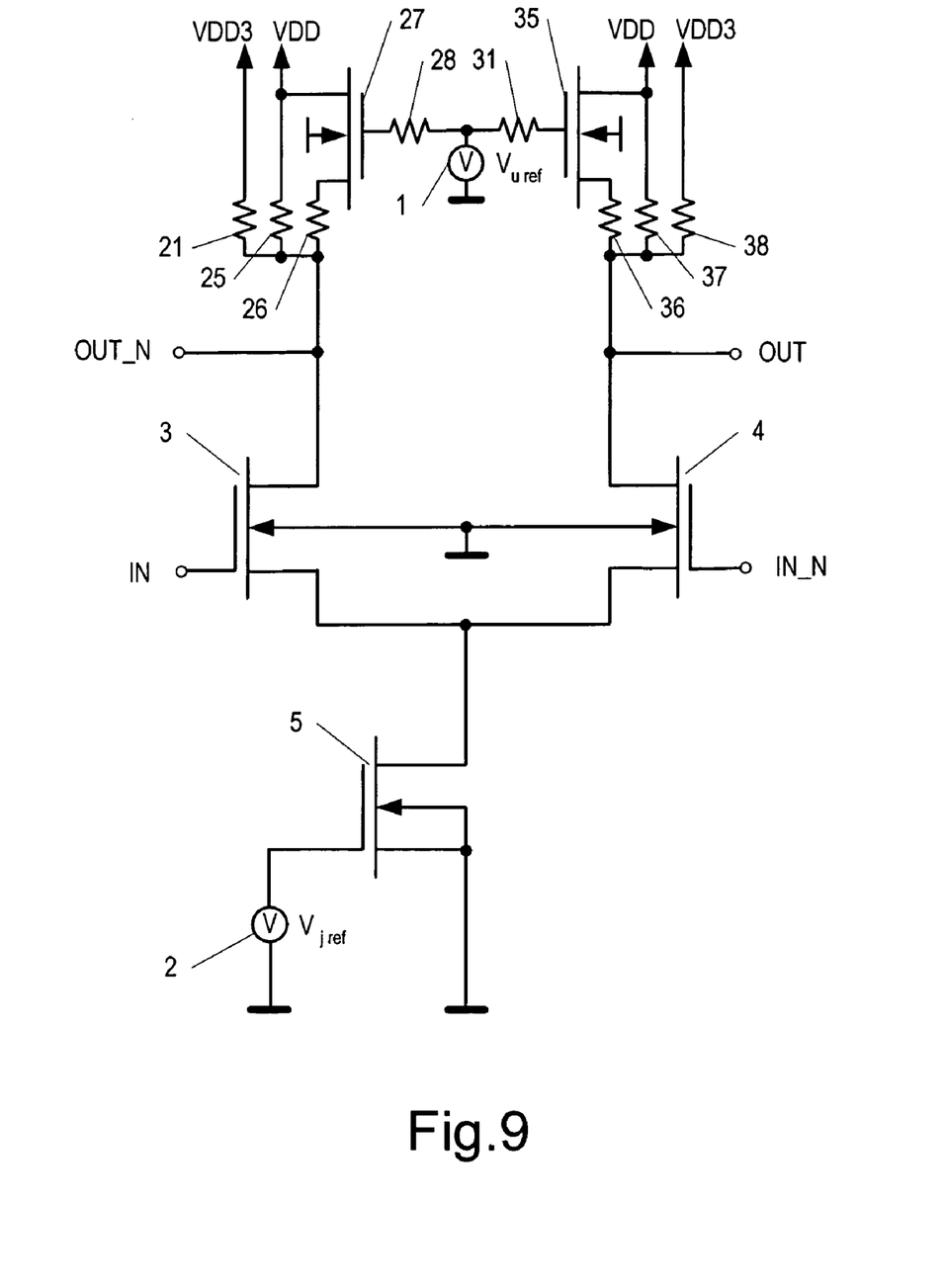
FIG. 9 shows a differential current mode inverter stage of an advanced design suitable for the implementation of extremely high speed amplifiers and receivers.

In an amplifier, a chain of amplifiers are needed to increase the power of the signal from that inside the chip to a level sufficient to amplifier the output load. For example, in FIG. 2, a chain of such amplifiers is shown, where each amplifier is a differential inverter. Differential inverters are preferred over single ended inverters in very high speed circuits due to higher noise immunity, lower current injection into the power supplies and lower EMI. However, it shall be noted that single ended inverters are also included within the scope of the present invention. The circuit of such a differential inverter is shown in FIG. 9, using a pull up load comprising circuit elements 21,25, 26,27, 28 and 31,35,36, 37,38 that can be adjusted to allow the propagation delay to be predetermined using methods described in patent applications U.S. 60/383,120 and U.S. 60/383,131 by the present inventor. The voltage reference 1 as also described in the same patent applications, can be used to control the propagation delay of the stage. Alternatively, simpler structures known in the prior art can be used without the means to control propagation delay, though with lower performance due to the variation in the propagation delay of the stages causing variations in the location of the filter poles.

Figure 2:
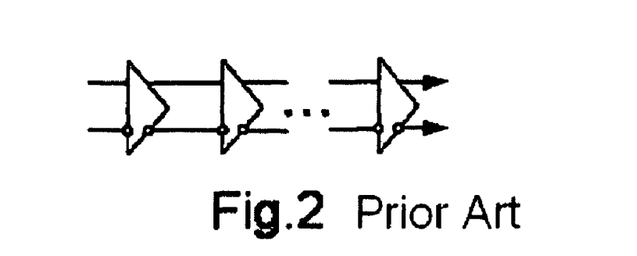
FIG. 2 shows a conventional output buffer.
Figure 6A:
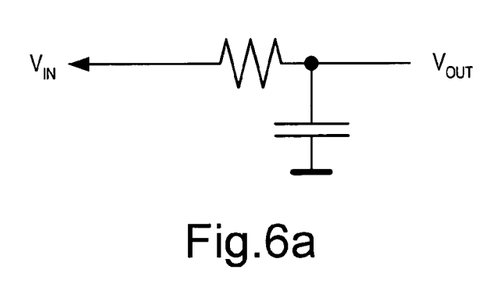
FIG. 6 shows an RC network and equalised RC network using a feed forward finite impulse response filter.

Each stage of an amplifier shown in FIG. 2 can be considered as an ideal buffer and a filter with a single pole, such as formed by an RC network in FIG. 6a. This network has a cut-off frequency which reduces the slew rate of the signal, and thus, this RC network cannot be used to drive signals with frequencies close to the cut off frequency. The R is primarily the pull up resistance and the C is formed by the parasitic capacitances of the transistors.

Figure 6B:
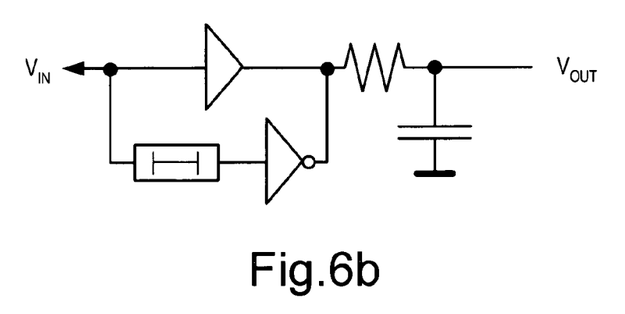

The channel driven by the amplifier can also be approximated by a similar RC network shown in FIG. 6b, where the R is the output impedance and C is the capacitance, formed mainly by the ESD structure and output transistors.

It is possible to improve the performance of such an amplifier stage by using a simple Finite Impulse Response (FIR) filter shown in FIG. 6b, where the input signal is applied to the output with a delay.

Figure 4:
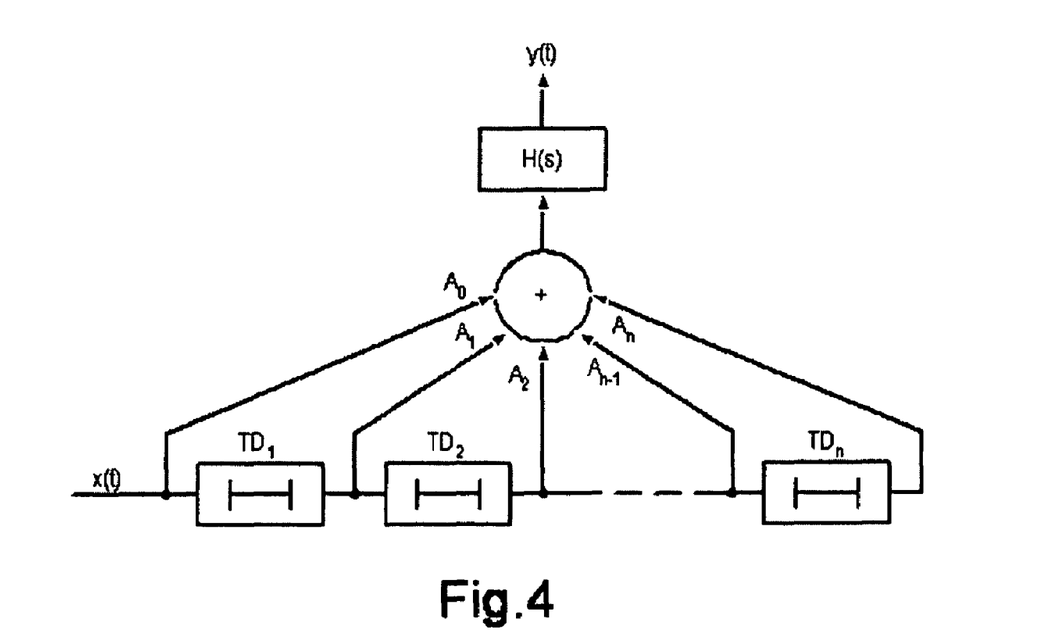
FIG. 4 shows a general finite impulse response filter using feed forward elements.

In a general case, there can be more than one tap in the filter. This is shown in FIG. 4, as a FIR filter plus a channel response function H(s). This system can be analysed to create an overall response. The weighting coefficients are generally different for each tap and this is achieved in the context of an integrated circuit amplifier by sizing or scaling transistors and other elements appropriately. This scaling is well known and is routinely applied by VLSI design engineers. This response is, for the system in FIG. 4:

$$X(s) = \frac{1}{s} X(s) \cdot H(s) = \left( \prod_k \frac{1}{s+p_k} \right) \cdot \left( \prod_{k \neq 0} p_k \right)$$

$$Y(s) = X(s) \cdot H(s) \cdot \sum_n a_n e^{-sTd_n} = \left( \prod_k \frac{1}{s+p_k} \right) \cdot \left( \prod_{k \neq 0} p_k \right) \cdot \left( \sum_n a_n e^{-sTd_n} \right)$$

$$y(t) = \oint_C \left( \prod_k \frac{1}{s+p_k} \right) \cdot \left( \prod_{k \neq 0} p_k \right) \cdot \left( \sum_n a_n e^{-sTd_n} \right) e^{st} ds$$

-continued $$y(t) = \sum_k \left( \left( \prod_{j \neq k} \frac{1}{p_j - p_k} \right) \cdot \left( \prod_{k \neq 0} p_k \right) \cdot \left( \sum_n a_n (1 - u(t - Td_n) \cdot (e^{-p_k \cdot (t - Td_n)} - 1)) \right) \right)$$

Figure 5:
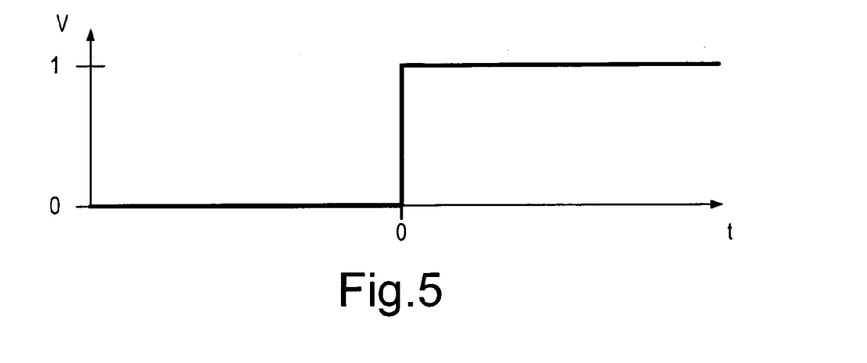
FIG. 5 shows a step response, which is the ideal transfer function for the whole channel, namely a step function.

These response functions can be determined for any FIR filter by any competent electrical engineer: the subject material is taught extensively at undergraduate level, is described in numerous texts and as DSP, is practised widely. The analysis is included here for ease of understanding. In the case of a simple single tap filter, such as FIG. 6b, when a pulse shown in FIG. 5b is applied to the system, the output of the amplifier becomes as shown by the uppermost of the waveforms in FIG. 7. This compensates for the inertia of the RC network, which would give the lowermost of the waveforms in FIG. 7 if no compensation is applied to this system. The combination of the channel response and the pre-emphasis gives the centre waveform in FIG. 7. It is apparent from this that the pre-emphasised signal has a faster settling time and allows the entire circuit to operate with a higher bandwidth. These plots are normalised, but in reality the expanded bandwidth is paid for by reduced amplitude of the signal after pre-emphasis and the channel function. This is a serious problem in practise as the reduced amplitude of the simple FIR causes a reduction in the noise margin of the channel, and increases bit error rates.

The case of a single pole is trivial in its analysis. The principle of its behaviour has been explained as well as the problem of reduced amplitude which arises in that case.

Figure 3:
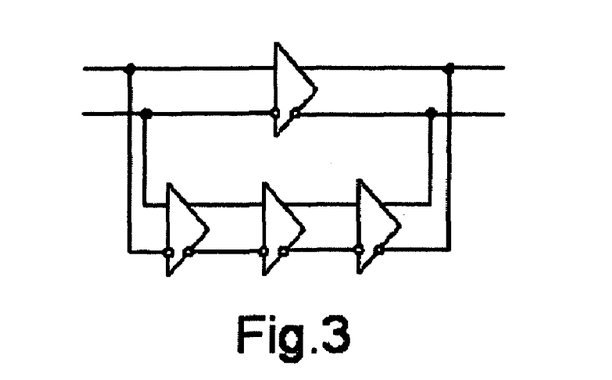
FIG. 3 shows one stage of an amplifier with a delayed feed forward.

Consider now FIG. 3 where the same circuit is built using inverters, such as shown in FIG. 9. This circuit is equivalent to the circuit in FIG. 6b, using scaling to achieve the proper weighting of the feed forward components.

The dynamic behaviour of the circuit shown in FIG. 3 can be considered starting with the situation where the circuit has settled to a logical zero. The transition to a logic 1 on the input causes the gate 1 to drive a high level after a single gate propagation delay. Stage 4 in FIG. 3 causes the output to be driven for a period of time dependent on the propagation delay through the chain of buffers 2, 3 and 4. Note that the polarity of the second chain causes the signal to be driven in the opposite direction when it has settled, which reduces output amplitude.

The weight coefficients of the main chain formed by gate 1 and an auxiliary chain of gates 2, 3 and 4 are chosen by determining the RC of the uncompensated inverter, such as by applying a step function to a chain of inverters and observing the response, then defining how much amplitude can be expended on equalisation, then identify the time delay desired through a delay line of a number of stages using the formula:

Time delay:=$rc.ln((1+v)/(1-v))$, where v is the new relative amplitude and ln is the natural logarithm. The next step is to determine the number of stages needed to implement this delay in stages, which is a rounded number of the ratio of the time delay required and the propagation delay of a single stage. From this the time delay can be determined for the actual chain of inverters that can be implemented in the design. For differential logic, each stage can act as a buffer or an inverter simply by swapping the polarity of the connections between the two stages, so there is no need to ensure the chain has an odd number of stages, which would be the case if single ended logic is used to implement the present invention. When the time delay is known, the proper voltage drop at that time can be recalculated, as $$V := (e^{td/rc} - 1)/(e^{td/rc} + 1),$$

and the transistors sized appropriately to achieve that weighting. For example, if half the amplitude is required, the main stage must be three times the strength of the feed forward stage, so the transistors in the feed forward stage would be one third the width of the transistors in the main stage, and their resistors are scaled similarly to have three times less conductivity or three times larger in value.

Unfortunately, the intermediate nodes of the feed forward chain are affected by RC loading that causes them to be limited in the same way as the main stage. To avoid this problem, the delayed signal can be applied from the main chain of inverters in the amplifier: that is a signal taken from further down the chain of inverters in the amplifier. Each inverter sees an equalised signal. At the optimum level of the implementation of the present invention, this results in the topology, where there is a feed back chain as well as feed forwards, creating a series of nested equalisation loops, as illustrated by an example embodiment of FIG. 1.

Figure 1:
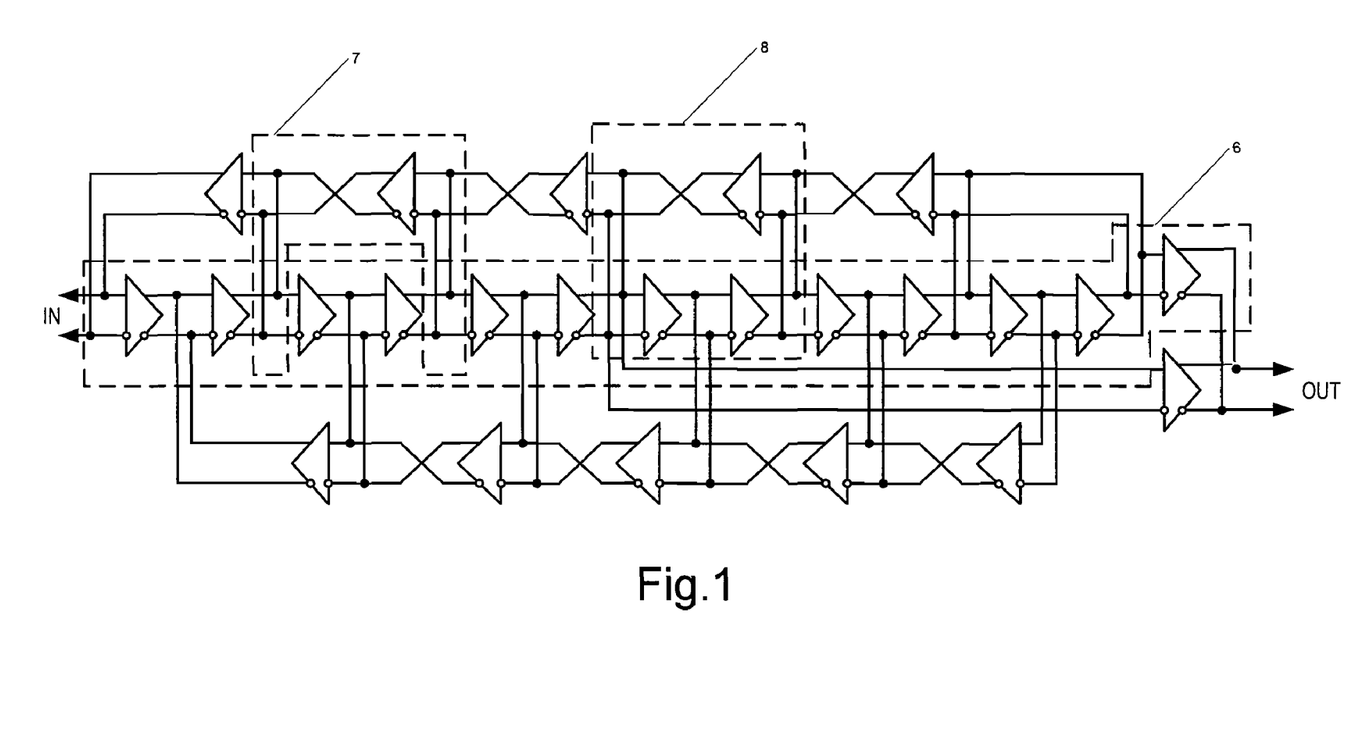
FIG. 1 shows an example embodiment of an amplifier according to the present invention.
Figure 1A:
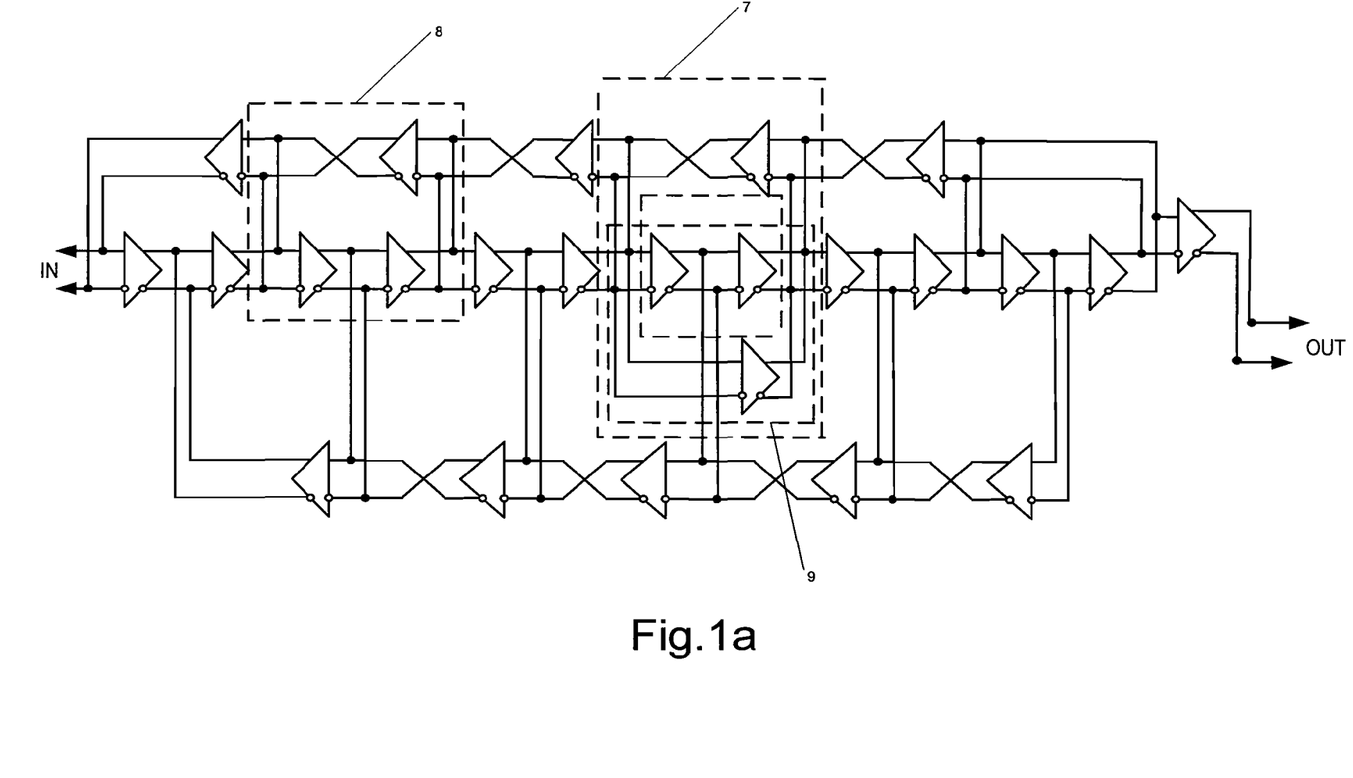
FIG. 1A shows an example embodiment of an amplifier according to the Present invention.

It is appreciated that the circuit as shown in FIG. 1 and FIG. 1A are not limiting the invention, the general concept being an amplifier circuit comprising a main chain 6 of amplification or buffer stages and at least one auxiliary chain 7 nested between one node in the main chain and another node, which is not the next node, to form a series of feed back 8 or feed forward 9 nested equalization loops.

It shall be also understood that in the absence of this limitation, the above circuit would neither form a feed back, nor a feed forward circuit, while the auxiliary stage would become a part of the main chain. The preferred implementation shown in FIG. 1 also changes the response of the amplifier for small signals from a finite impulse response to an infinite impulse response (IIR) under small signal conditions. The analysis of IIR systems is complex, but for large signals the amplifier remains a FIR system and the whole chain can be calculated as a FIR systems without material error in the overall response as a combined IIR and FIR system.

The same topology of FIR using the taps from this chain to the output stages which apply the equalised signal to the output, but these stages are excluded from the chain because this final stage has different characteristics with additional requirements, such as an output impedance that can be set to match the impedance of the transmission line and the weight of the stages can be calculated for different RC constants than for which apply to internal stages due to additional ESD structures that relate to the amplifier, and other parasitics.

The Miller reflection of the capacitance of the ESD structure and load back into the amplifier chain can be taken into account when determining the equivalent RC of any particular stage, in a highly optimised implementation of the present invention.

Figure 10:
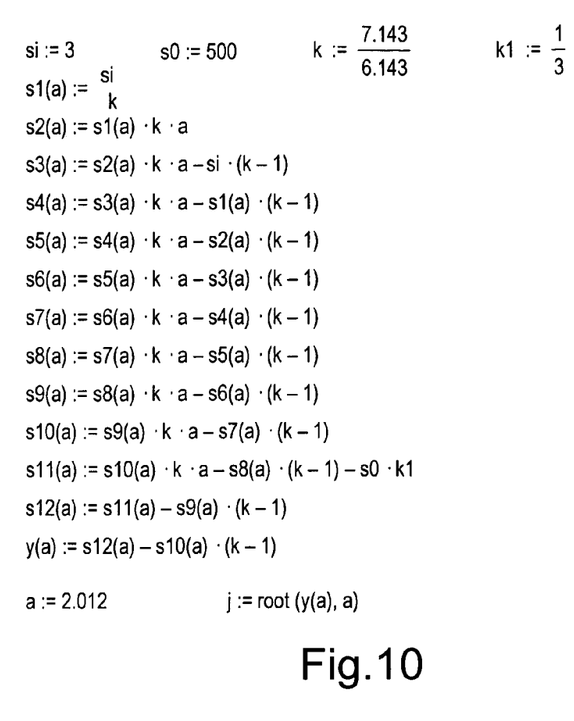
FIG. 10 shows a system of non-linear equations for determining the relative sizing of the main and auxilliary gates in the amplifier according to the present invention for the example amplifier used to illustrate the invention herein.

The final step is to calculate all the sizes of the transistors and pull up structures in the main chain, because the additional elements are scaled from the main elements, according to the procedure already outlined but using normalised values. To make each stage operate at the same conditions it is preferable if the ratio between the gate size and its load is the same for each stage. This can be described as a system of equations where the size of the input stage and the output stage can be defined from the drive capability of the internal logic in the integrated circuit which the amplifier serves, and the load. A set of equations describing such system is shown in FIG. 10, using coefficients between the main and auxilliary gates for the first and last stage. Such a system of equations can be solved using automatic tools such as MathCAD, or given enough perserverence, manually.

Figure 11:
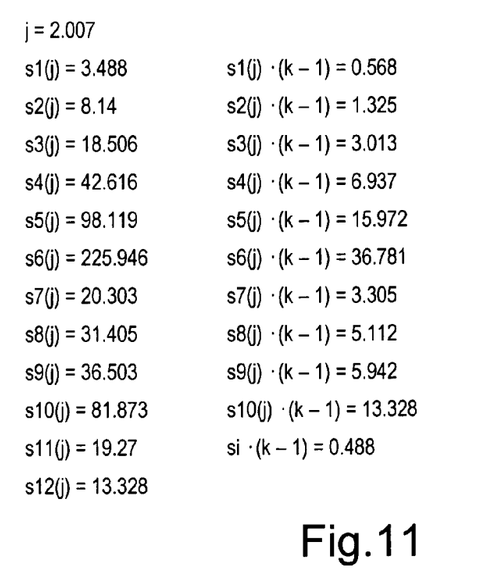
FIG. 11 shows the solution to the set of equations shown in FIG. 10.

The resulting relative sizes of the main and auxilliary gates from the equations shown as an example in FIG. 10, is given in FIG. 11 for completeness.

Figure 8:
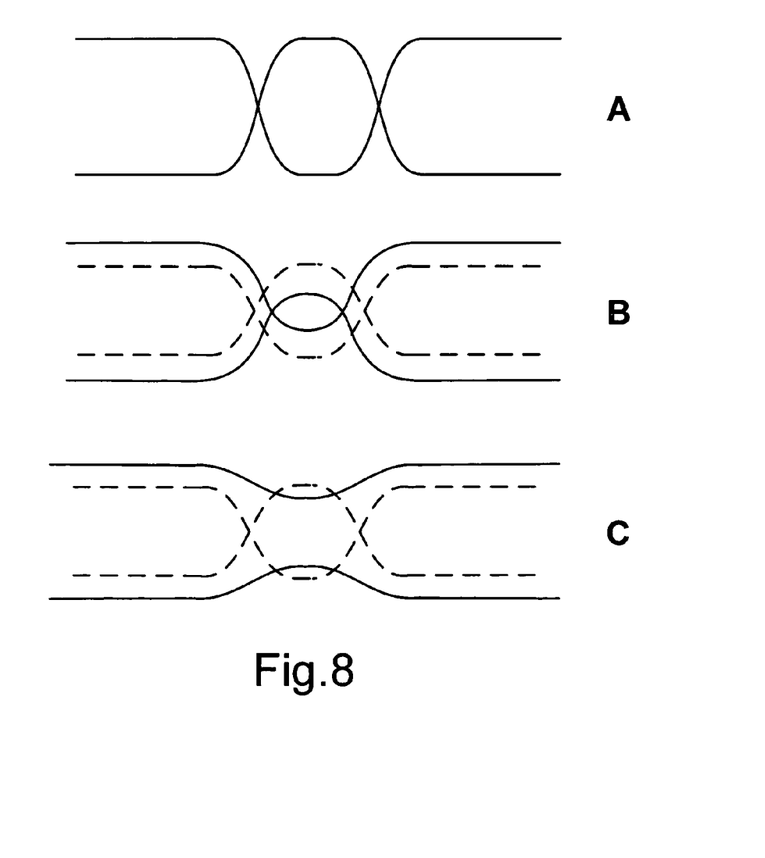
FIG. 8 shows wave diagrams of equalised and non-equalised pulses.

As a result of the application of the present invention, the amplifier can operate with shorter pulses than would be the case without the present invention. This is shown in FIG. 8, where 8a shows the input signal, 8b is the signal at an intermediate node and 8c is the output signal, the dashed signal being the signal in an amplifier nodes according to the present invention and the solid signal being the amplifier with the same main chain but without the present invention.

With careful design of the feedback loops, the voltage loss in the whole chain can be kept at a low level, such as 15% for internal compensation and 50% for compensation of the external poles, that is in the load and ESD structure. This reduction in amplitude of the signal enables the bandwidth of the amplifier to be doubled compared to a driver built with the traditional approach.

It will be apparent to anyone skilled in the art that the present invention can be used for a receiver or as a driver as well as for an amplifier. The description of the present invention has considered a driver in many examples for the sake of completeness, including reference to the treatment of ESD structures and compound loads.

The invention claimed is:

1. An amplifier circuit for receiving an input signal and providing an output signal, comprising:
   a main chain of logic stages with a plurality of nodes therebetween; and at least one auxiliary chain nested between one node in the main chain and another node, which is not the next node, to form a series of at least one feed back nested equalization loop and at least one feed forward nested equalization loop;
   whereby the input signal is fed serially down the main chain and is also fed through the said at least one auxiliary chain and summed to provide the output signal.

2. An amplifier according to claim 1 wherein the logic stages are amplification or buffer stages, such as differential buffers.

3. An amplifier according to claim 1 wherein the input signal fed through the main chain of logic stages is fed forward.

4. An amplifier according to claim 1, wherein the input signal fed through the main chain of logic stages is fed backwards.

5. An amplifier according to claim 1, incorporating a multi-tap filter where a signal on particular nodes are the sum of more than two signals taken from other nodes.

6. An amplifier circuit for receiving an input signal and providing an output signal, comprising:
   a main chain of logic stages with a plurality of nodes therebetween, and at least one auxiliary chain comprising at least two buffer stages nested between one node in the main chain and another node, which is not the next node, to form a series of at least one feed back and one feed forward nested equalization loop;
   whereby the input signal is fed serially down the main chain and is also fed through the said at least one auxiliary chain and summed to provide the output signal.

7. An amplifier according to claim 6, wherein at least one logic stage is a differential inverter.

8. An amplifier according to claim 6, incorporating a multi-tap filter where a signal on particular nodes is the sum of more than two signals taken from other nodes.

9. An amplifier circuit for receiving an input signal and providing an output signal, comprising:

a main chain of logic stages with a plurality of nodes therebetween;

at least one auxiliary chain nested between one node in the main chain and another node, which is not the next node, to form a series of at least one feed back and one feed forward nested equalization loop; and a multi-tap filter, each tap having a respective weighting coefficient, for applying the input signal to the output signal;

whereby the input signal is fed serially down the main chain and is also fed through the at least one auxiliary chain and summed to provide the output signal.

10. An amplifier circuit according to claim 9, wherein at least one logic stage is an inverter.

11. An amplifier circuit according to claim 9, wherein at least one logic stage is a buffer.

12. An amplifier circuit according to claim 10, wherein the respective weighting coefficients are determined as a function of a RC time constant of an uncompensated inverter.

* * * * *